United States Patent
Ito et al.

(10) Patent No.: US 7,166,965 B2
(45) Date of Patent: Jan. 23, 2007

(54) WAVEGUIDE AND MICROWAVE ION SOURCE EQUIPPED WITH THE WAVEGUIDE

(75) Inventors: Hiroyuki Ito, Narita (JP); Noriyuki Sakudo, Kanazawa (JP)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 10/698,673

(22) Filed: Oct. 31, 2003

(65) Prior Publication Data

US 2004/0090185 A1    May 13, 2004

(30) Foreign Application Priority Data

Oct. 31, 2002  (JP) ............................. P2002-319063

(51) Int. Cl.
  *H01J 7/24*  (2006.01)
  *H01J 3/14*  (2006.01)
  *H01J 3/26*  (2006.01)
  *C23C 16/00*  (2006.01)
  *H05B 31/26*  (2006.01)
  *G21K 1/08*  (2006.01)

(52) U.S. Cl. ..................... 315/111.91; 118/723 MW; 315/111.81; 250/396 R; 250/423 R

(58) Field of Classification Search ........... 315/111.81; 118/723 MW; 156/345.41
See application file for complete search history.

(56) References Cited

U.S. PATENT DOCUMENTS

| | | | | | |
|---|---|---|---|---|---|
| 4,446,558 | A | * | 5/1984 | Sepp et al. .................... | 372/64 |
| 4,952,273 | A | * | 8/1990 | Popov .......................... | 216/70 |
| 5,359,177 | A | * | 10/1994 | Taki et al. ............. | 219/121.43 |
| 5,568,304 | A | * | 10/1996 | Baur .......................... | 398/202 |
| 6,184,624 | B1 | * | 2/2001 | Inouchi .................. | 315/111.81 |
| 6,204,560 | B1 | * | 3/2001 | Daetwyler et al. .......... | 257/745 |
| 2004/0042736 | A1 | * | 3/2004 | Capewell et al. ............. | 385/89 |
| 2005/0063659 | A1 | * | 3/2005 | Jansen ........................ | 385/130 |

FOREIGN PATENT DOCUMENTS

| | | |
|---|---|---|
| JP | 62-278802 | 12/1987 |
| JP | 05129802 A * | 5/1993 |
| JP | 08-190997 | 7/1996 |
| JP | 09-198937 | 7/1997 |
| JP | 10-070112 | 3/1998 |
| JP | 00-077335 | 3/2000 |

* cited by examiner

*Primary Examiner*—Parviz Hassanzadeh
*Assistant Examiner*—Rakesh Dhingra
(74) *Attorney, Agent, or Firm*—Patterson & Sheridan LLP

(57) ABSTRACT

A waveguide of the present invention comprises a waveguide main body made of a material selected from a boron nitride or an aluminum oxide, and a thin film made of a titanium nitride to cover an outer peripheral surface of the waveguide main body. The waveguide of the present invention can efficiently guide an electromagnetic wave such as a microwave, and has high physical and chemical durability.

9 Claims, 2 Drawing Sheets

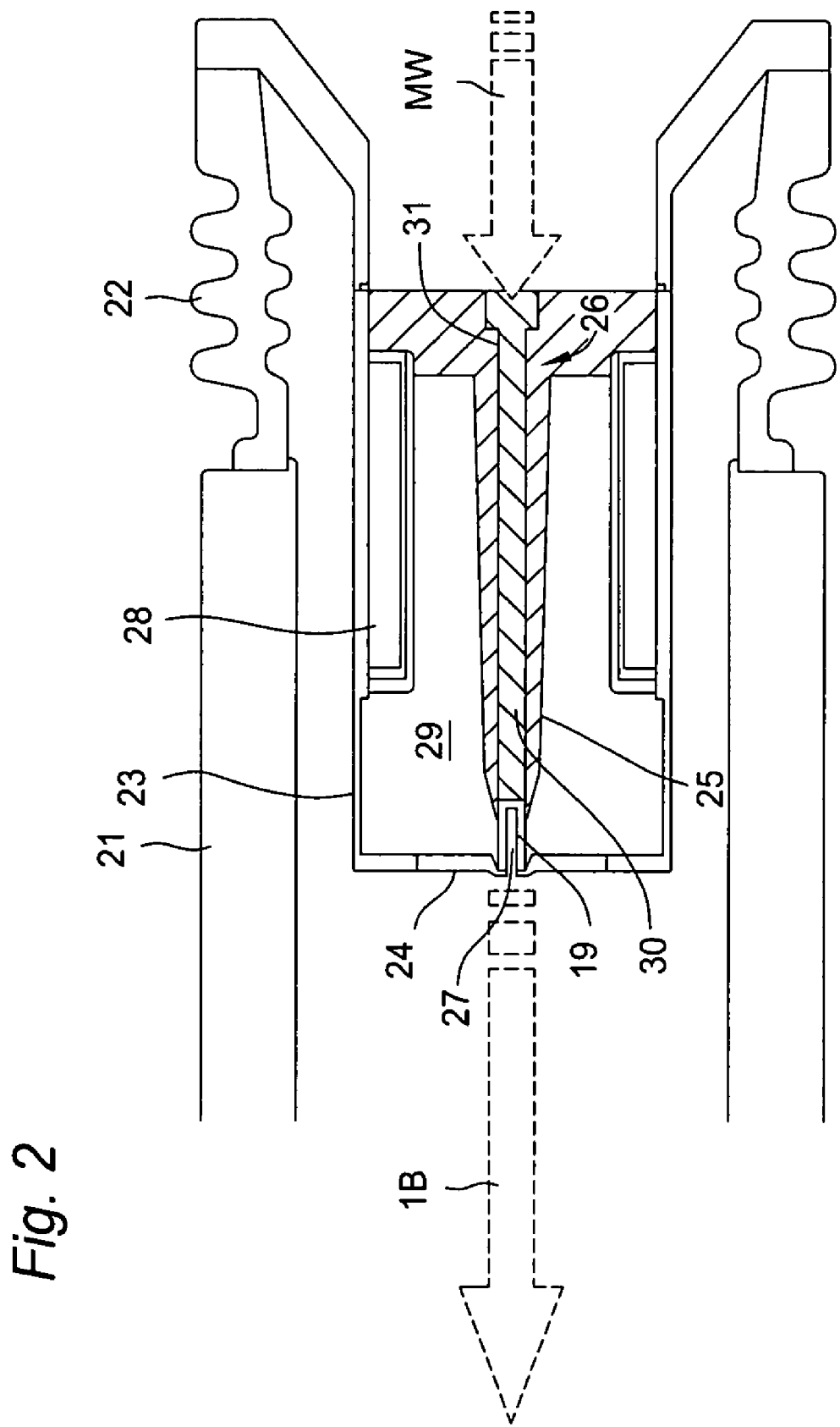

WAVEGUIDE AND MICROWAVE ION SOURCE EQUIPPED WITH THE WAVEGUIDE

BACKGROUND OF THE INVENTION

1. Field of the Invention

The present invention relates to a waveguide and a microwave ion source.

2. Description of the Related Art

Conventionally, a waveguide has widely been used to guide an electromagnetic wave such as a microwave. As such a waveguide, a waveguide has generally been known, in which a core material made of a nonconductor is inserted into a metal tube molded in a cylindrical shape, and an inner peripheral surface of the metal tube and an outer peripheral surface of the core material are bonded to each other. A waveguide has also been known, in which an outer peripheral surface of a nonconductor is covered with a thin film made of a metal such as aluminum or copper (e.g., see Japanese Patent Laid-Open SHO 62 (1987)-278802).

However, there is room for improvement in all the conventional waveguides when they are applied to microwave ion sources or the like.

That is, in the case of the waveguide in which the core material is inserted into the metal tube, it is difficult to completely bond the inner peripheral surface of the metal tube and the outer peripheral surface of the core material to each other, and a very small gap is frequently generated between the surfaces. If such a gap is generated between the waveguide and the core material, a conduction loss is increased due to reflection of an electromagnetic wave in the gap. Additionally, for example, as an atmospheric temperature of the microwave ion source rises even to several hundred ° C., the metal tube and the core material may shift from each other due to a difference in coefficients of thermal expansion to generate a gap. Further, the difference in coefficients of thermal expansion between the metal tube and the core material may cause physical deterioration of the waveguide.

On the other hand, the waveguide described in Japanese Patent Laid-Open SHO 62 (1987)-278802 is designed to solve designing and processing problems of the waveguide in which the core material is inserted into the metal tube. However, it is still insufficient for practical application as a phenomenon of peeling-off of the metal thin film from the waveguide main body or a phenomenon of deterioration of the thin film itself tends to occur.

SUMMARY OF THE INVENTION

The present invention was made with the foregoing problems of the conventional art in mind, and objects of the present invention are to provide a waveguide which is capable of efficiently guiding an electromagnetic wave such as a microwave and is highly durable physically and chemically, and a microwave ion source which uses the waveguide.

In order to achieve the object, a waveguide of the present invention comprises a waveguide main body made of a boron nitride or an aluminum oxide, and a thin film made of a titanium nitride to cover an outer peripheral surface of the waveguide main body.

In the waveguide of the present invention, the waveguide main body is made of a boron nitride or an aluminum oxide, and the outer peripheral surface of the waveguide main body is covered with a thin film made of a titanium nitride, whereby the outer peripheral surface of the waveguide main body and the thin film are sufficiently bonded to each other. Thus, reflection of an electromagnetic wave such as a microwave on the outer peripheral surface of the waveguide main body can be sufficiently suppressed, whereby high-level conductivity can be achieved. Additionally, a combination of the waveguide main body and the thin film makes peeling-off difficult and deterioration thereof caused by a difference in coefficients of thermal expansion between both. Thus, it is possible to maintain the high-level conductivity for a long time.

In the waveguide of the present invention, there is no particular limitation on a shape of the waveguide main body because the outer peripheral surface of the waveguide main body is covered with the thin film. Thus, flexibility of designing or processing can be improved compared with a waveguide in which the core material is inserted into the metal tube. For example, even in the case of providing a curve of a predetermined angle to the waveguide main body or a special shape such as a wedge shape, it is possible to obtain a highly conductive waveguide.

In the waveguide of the present invention, preferably, the waveguide main body is made of a boron nitride. By combining the waveguide main body made of a boron nitride with the thin film made of a titanium nitride, it is possible to achieve higher conductivity, better adhesion, improved peeling prevention and longer durability with respect to prior waveguides.

A microwave ion source of the present invention comprises a plasma generation chamber into which gas is introduced, and a waveguide which comprises a waveguide main body made of a boron nitride or an aluminum oxide, and a thin film made of a titanium nitride to cover an outer peripheral surface of the waveguide main body, and introduces a microwave into the plasma generation chamber. The gas introduced into the plasma generation chamber is formed into plasma by microwave discharge to generate ions.

Thus, by using the waveguide of the present invention as a waveguide of a microwave ion source, it is possible to maintain high conductivity with respect to a microwave for a long time, and to carry out efficient plasma generation by microwave discharging.

BRIEF DESCRIPTION OF THE DRAWINGS

FIG. 2 is a sectional view when a source head and a plasma chamber of the microwave ion source shown in FIG. 1 are cut on a plane which includes a microwave introduction path.

DETAILED DESCRIPTION OF THE PREFERRED EMBODIMENT

Figure 1:
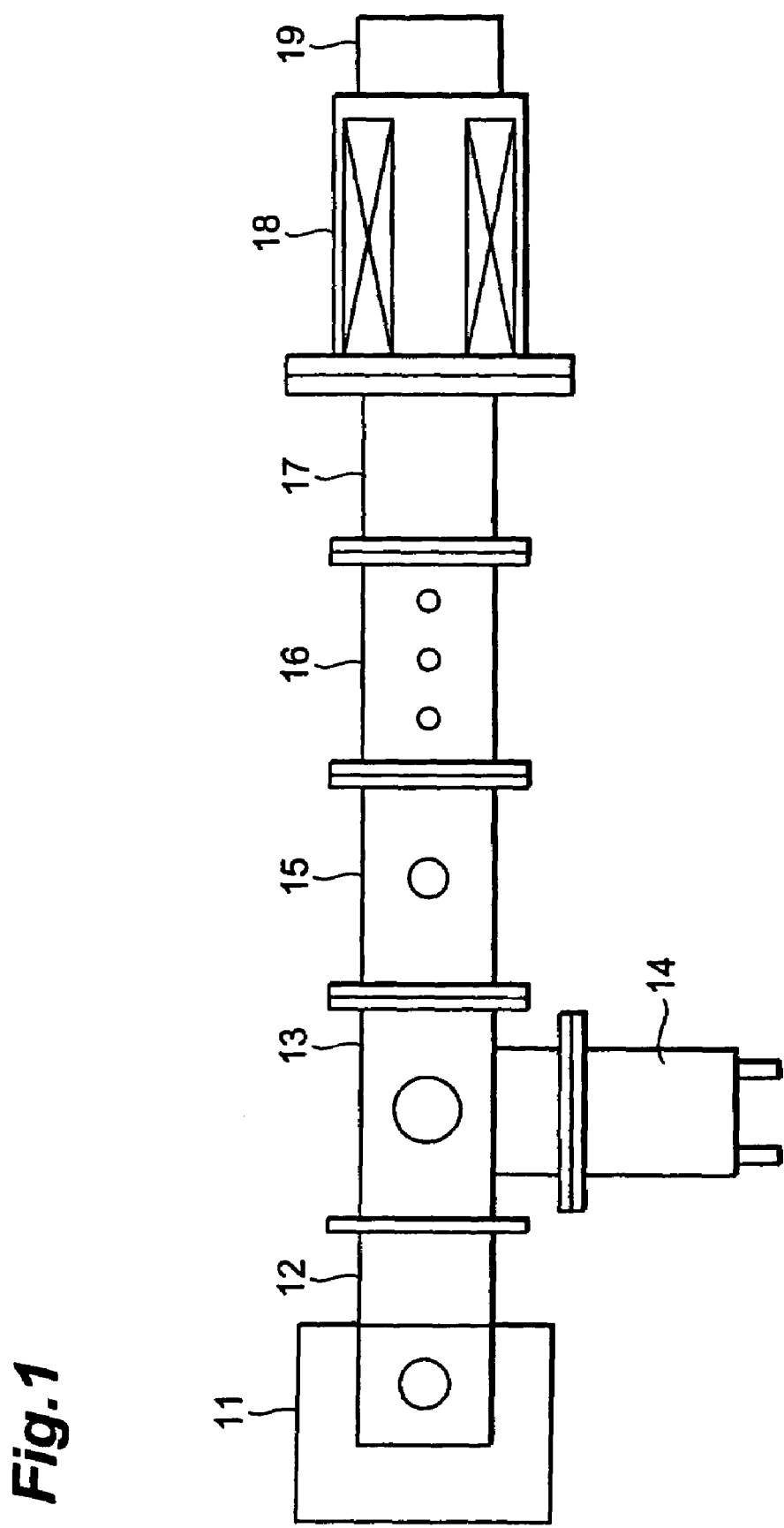
FIG. 1 is a schematic view showing a preferred embodiment of a microwave ion source of the present invention.

The preferred embodiments of the present invention will be described in detail with reference to the accompanying drawings. In the drawings, similar or equivalent portions are denoted by similar reference numerals, and repeated explanations will be avoided.

FIG. 1 is a schematic view showing a preferred embodiment of a microwave ion source of the present invention. The microwave ion source shown in FIG. 1 comprises a waveguide of the present invention as described later.

In FIG. 1, a magnetron 11, a magnetron mount 12, a circulator 13, a power monitor 15, a stub tuner 16, an interface tube 17, and a source head 18 are connected in this order to constitute a microwave ion source. A plasma chamber 19 is disposed on the front of the source head 18. A dummy road 14 is disposed on the side of the circulator 13.

The magnetron 11 generates a predetermined microwave (e.g., 2.45 GHz). The microwave is introduced into the source head 18 to be used for plasma generation. The circulator 13 diverts the reflected microwave which returns to the magnetron 11 side to the dummy road 14. The diverted microwave is absorbed by the dummy road 14 to be converted into heat. The stub tuner 16 makes adjustments by reducing reflection of the microwave to consume more microwaves for plasma generation. The power monitor 15 for detecting the microwave, the interface tube 17 etc., are not essential components. They can be omitted as occasion demands.

FIG. 2 is a sectional view when the source head 18 and the plasma chamber 19 are cut on a plane which includes an introduction path of the microwave. In FIG. 2, a source bushing 22 is formed on the magnetron side (inlet side of microwave MW) of the source chamber 21, and its tip is bent toward the inside of the source head. A magnet yoke 23 is disposed on the tip of the bent portion to provide space for inserting the source head 18. An outlet side plate 24 having an opening is disposed on the front of the magnet yoke 23, and the concave plasma chamber 19 is arranged in the opening of the magnetron side of the plate 24. Concave space 27 of the plasma chamber 19 is a plasma generation area, to which predetermined gas is supplied.

A convex magnet pole 25 is arranged in a manner that the tip of the convex portion is close to the plasma chamber 19, and the bottom side face is bonded to the inner wall surface of the side of the magnet yoke 23. A waveguide 26 is arranged in the magnet pole 25 to communicate from the bottom center to the tip of the convex portion. The microwave introduced into the source head 18 is introduced through the waveguide 26 into the plasma chamber 19.

The waveguide 26 of the embodiment is constructed by covering the outer peripheral surface of the waveguide main body 30 made of a boron nitride (BN) with a thin film 31 made of a titanium nitride (TiN). There is no particular limitation on a method for forming a thin film. For example, a CVD method can be used. A thickness of the thin film is preferably 10 to 500 μm.

In space 29 formed by the inner wall surfaces of the magnetic yoke 23 and the plate 24 and the outer wall surfaces of the plasma chamber 19 and the magnet pole 25, a solenoid coil 28 is arranged to be wound around the convex portion of the magnet pole 25. Thus, a magnetic field is formed along an extracting direction of ions from the plasma chamber 19.

In such a microwave ion source, when a microwave is introduced through the waveguide 26 into the plasma chamber 19, electrons in the magnetic field are excited by the microwave, and collision of the excited electrons with gas in the plasma generation area 27 generates plasma which contains predetermined ions. Ions are extracted from the opening of the outlet plate 24 by an extraction electrode (not shown) to generate ion beams.

At this time, since reflection of the microwave on the outer peripheral surface of the waveguide main body is sufficiently suppressed by using the waveguide in which the outer peripheral surface of the waveguide main body made of BN is covered with the thin film of TiN, the microwave can be introduced into the plasma chamber 19 by high-level conductivity. An atmospheric temperature of the microwave ion source reaches even several hundred ° C. However, even under such a high temperature condition, peeling-off or deterioration thereof caused by a difference in coefficients of thermal expansion between the waveguide main body and the thin film is unlikely to occur, and the high-level conductivity can be maintained for a long time.

A material of the waveguide main body may be alumina ($Al_2O_3$). Preferably, however, the waveguide main body made of a boron nitride is combined with the thin film made of a titanium oxide for the purpose of good conductivity, adhesion, peeling prevention and durability with respect to an electromagnetic wave.

EXAMPLES

Next, the present invention will be described in more detail based on embodiments and comparative examples. However, the invention is in no way limited to the following embodiments.

Example 1

TiN was deposited on the outer peripheral surface of a waveguide main body made of BN by a CVD method to manufacture a waveguide 26 (thickness of TiN thin film: 200 μm) shown in FIG. 2. Then, the waveguide 26 was used to manufacture a microwave ion source as shown in FIGS. 1 and 2.

Example 2, Comparative Examples 1 to 6

In Example 2 and Comparative Examples 1 to 6, waveguides and microwave ion sources were manufactured similarly to Example 1 except for combinations of waveguide main bodies and thin films shown in Table 1.

Evaluation of Conductivity, Adhesion, Peeling Prevention and Durability with Respect to Electromagnetic Wave Subsequently, the microwave ion sources of Examples 1 and 2 and Comparative Examples 1 to 6 were used, and $BF_3$ was converted into plasma by a microwave of 2.45 GHz to generate B+. After execution of this process for 100 hours, conductivity, adhesion, peeling prevention, and durability with respect to an electromagnetic wave were evaluated for each waveguide. The obtained results are shown in Table 1. The evaluation shown in Table 1 is based on ranking A to D in which the Comparative Example 1 is a standard.

A: Much better compared with the Comparative Example 1. B: Better compared with the Comparative Example 1. C: Comparable to the Comparative Example 1. D: Inferior to the Comparative Example 1.

TABLE 1

|  | Waveguide main body | Thin film | Conductivity | Adhesion | Peeling prevention | Durability |
|---|---|---|---|---|---|---|
| Example 1 | BN | TiN | A | A | A | A |
| Example 2 | Al$_2$O$_3$ | TiN | A | B | A | A |
| Comparative Example 1 | BN | SiC | C | C | C | C |
| Comparative Example 2 | BN | C | B | D | A | C |
| Comparative Example 3 | BN | Ni | A | D | D | D |
| Comparative Example 4 | Al$_2$O$_3$ | SiC | C | A | A | A |
| Comparative Example 5 | Al$_2$O$_3$ | C | B | D | D | C |
| Comparative Example 6 | Al$_2$O$_3$ | Ni | A | D | D | D |

As described above, according to the present invention, it is possible to realize a waveguide which is capable of efficiently guiding an electromagnetic wave such as a microwave, and is highly durable physically and chemically, and a microwave ion source which uses the waveguide.

What is claimed is:

1. A waveguide of a microwave ion source, comprising:
   an elongated waveguide main body of the microwave ion source, the elongated waveguide main body being made of a material selected from the group consisting of a boron nitride and an aluminum oxide; and
   a thin film defining a microwave path made of a titanium nitride covering an outer peripheral surface of the waveguide main body, wherein the outer peripheral surface of the waveguide main body is bonded to the thin film.

2. waveguide according to claim 1, wherein the waveguide main body is made of a boron nitride.

3. The waveguide according to claim 1, wherein the outer peripheral surface of the waveguide main body is bonded to the thin film.

4. The waveguide according to claim 1, wherein the waveguide main body is made of an aluminum oxide.

5. The waveguide according to claim 1, wherein the waveguide main body has a wedge shape.

6. The waveguide according to claim 1, wherein the thin film is formed by a CVD method.

7. waveguide according to claim 1, wherein the thin film has a thickness of 10 to 500 μm.

8. The waveguide according to claim 1, wherein the thin film has a thickness of 200 μm.

9. The waveguide according to claim 1, wherein a reflection of an electromagnetic wave on the outer peripheral surface of the waveguide main body is suppressed.

* * * * *